United States Patent [19]

Lowenthal et al.

[11] Patent Number: 4,502,038
[45] Date of Patent: Feb. 26, 1985

[54] KEYBOARD SCANNING AND INTERFACE METHOD AND CIRCUIT

[75] Inventors: Richard W. Lowenthal, Los Gatos; Stephen C. Seike, Sunnyvale; Gregory V. Walsh, Palo Alto, all of Calif.

[73] Assignee: Convergent Technologies, Inc., Santa Clara, Calif.

[21] Appl. No.: 311,511

[22] Filed: Oct. 15, 1981

[51] Int. Cl.³ .............................................. G06F 3/02
[52] U.S. Cl. ........................... 340/365 S; 340/365 E; 340/365 R
[58] Field of Search ............ 340/365 S, 365 E, 365 R; 364/200 MS File, 900 MS File

[56] References Cited

U.S. PATENT DOCUMENTS

| | | | |
|---|---|---|---|
| 3,778,816 | 12/1973 | Cuccio | 340/365 S |
| 4,106,011 | 8/1978 | Melanson et al. | 340/365 E |
| 4,145,687 | 3/1979 | Masuda | 340/365 S |
| 4,222,038 | 9/1980 | Magerl | 340/365 S |
| 4,277,780 | 7/1981 | Sonderman et al. | 340/365 S |
| 4,381,502 | 4/1983 | Prame | 340/365 S |

OTHER PUBLICATIONS

IBM Technical Disclosure Bulletin, "Keyboard with Monopulse Key Sampling", Fisher & Pleshko, vol. 13, No. 1, Jun. 1970, pp. 72, 73.

Primary Examiner—Gerald L. Brigance
Attorney, Agent, or Firm—C. Michael Zimmerman

[57] ABSTRACT

A method and apparatus is disclosed for allowing simultaneous depression or chording of a multiple number of keys on a keyboard coupled through an interface circuit to a computer operating system. An arbitrary association can be made to the chord which is distinct from the association made with its component keys. A dedicated processor system in the keyboard peripheral scans and stores in a dedicated memory the identity of all keys detected in the depressed state during the scan of the keyboard. For transmission to the computer operating system, each key depression detected during the scan is represented as an 8-bit binary component and the most significant bit of each binary component is set to the same one of the two permissible binary values, except for the most significant bit of the binary component representing the last depressed key detected during the scan of the keyboard. The most significant bit of that component is set to other of the two permissible binary values.

14 Claims, 4 Drawing Figures

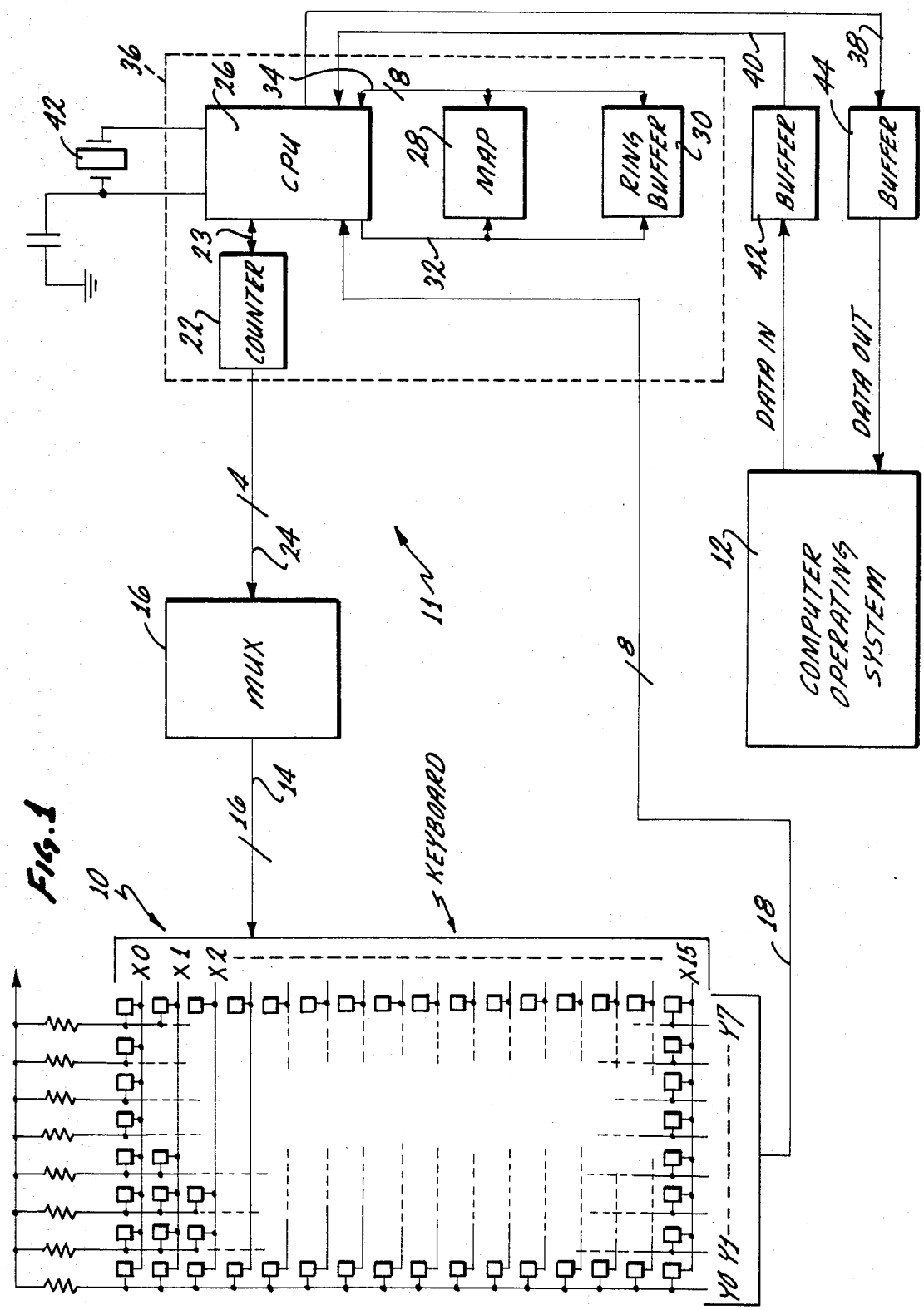

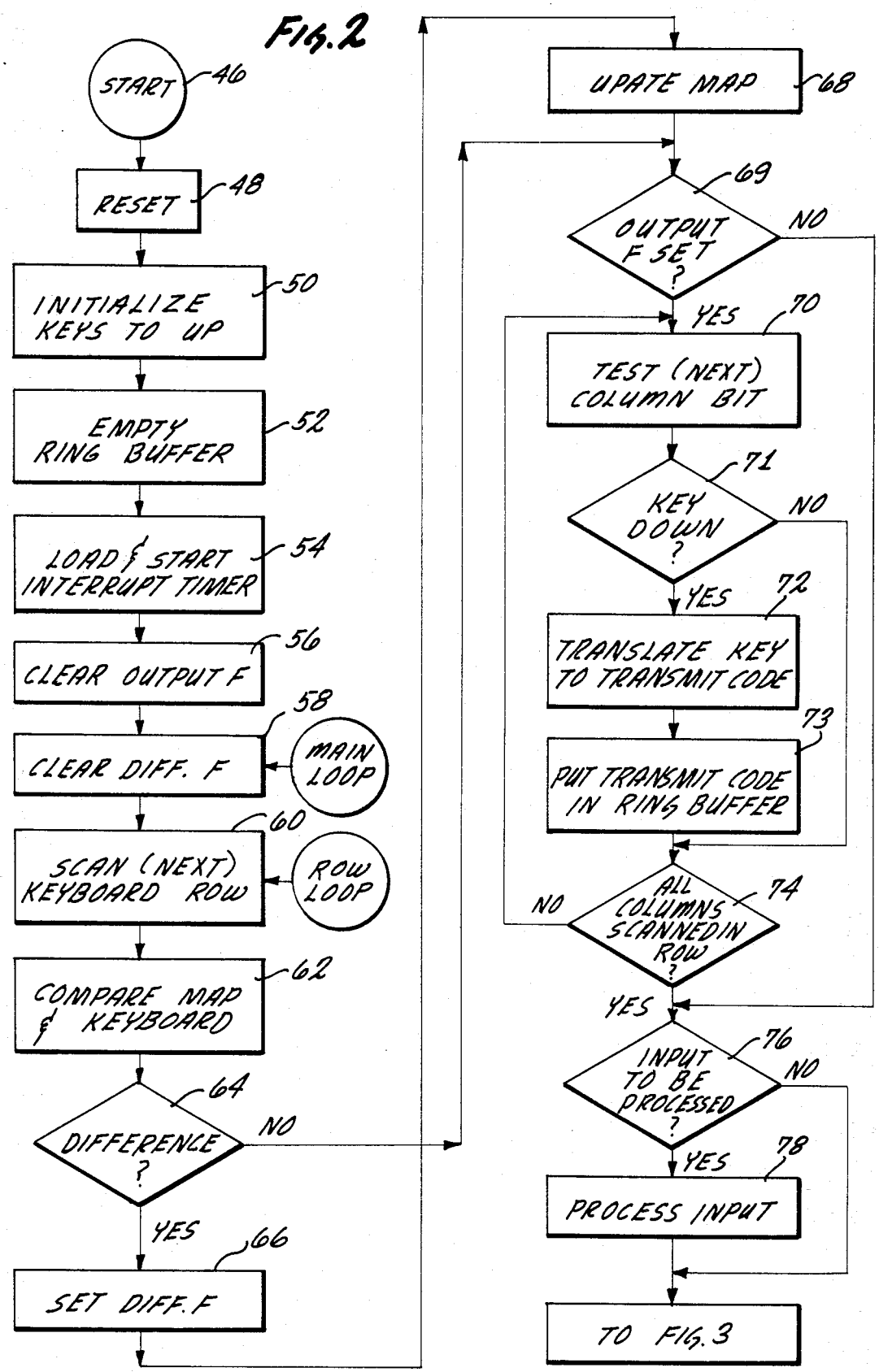

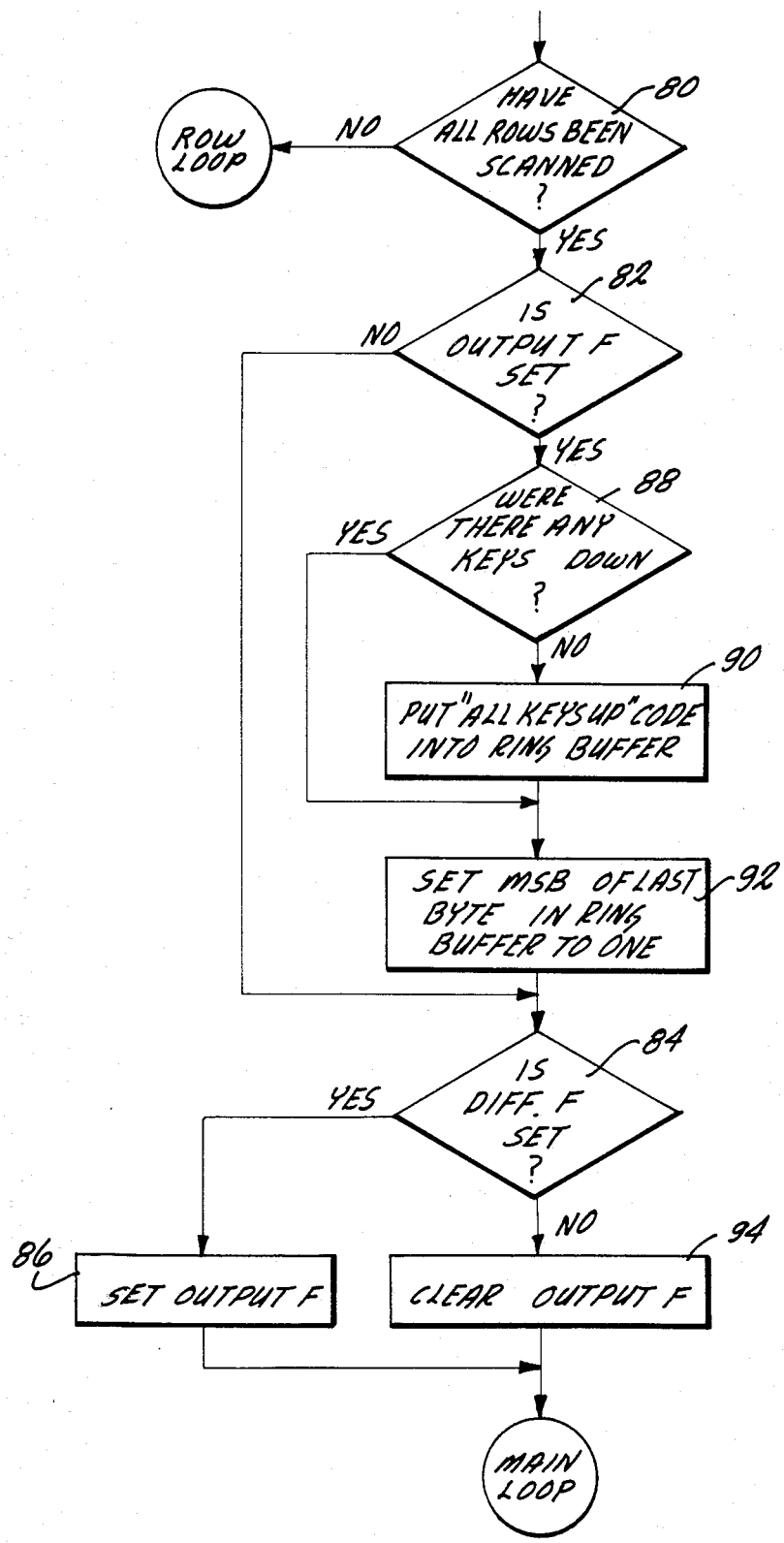

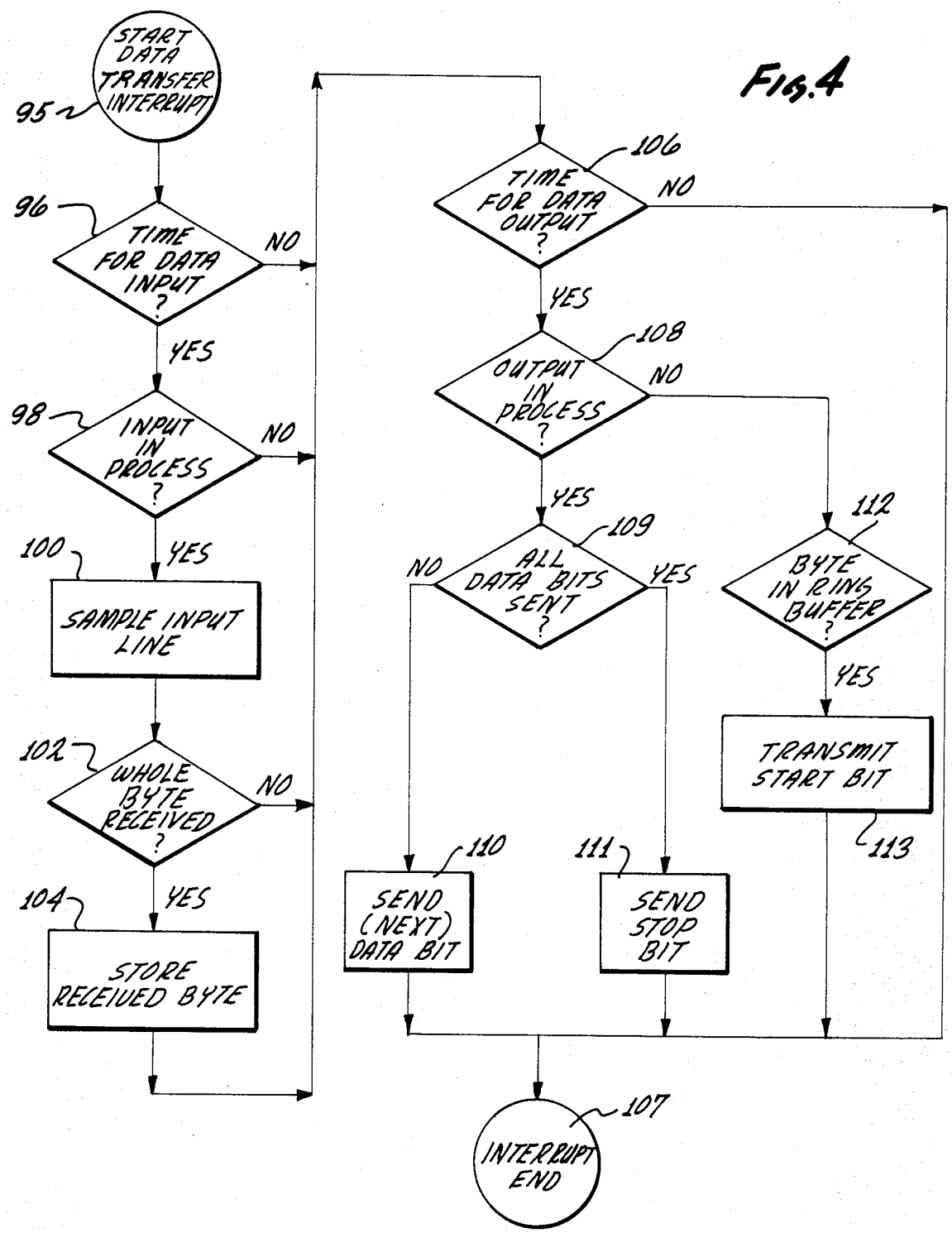

KEYBOARD SCANNING AND INTERFACE METHOD AND CIRCUIT

The present invention relates to keyboard communication, and in particular it relates to interface method and circuitry used to scan and to communicate the output of a keyboard to the data input to a data processing system.

Manually activated keyboards are widely used for entering information into a data processing system. For example, of the various means by which peripherals communicate or interface with a computer system, a manually activated typewriter-type keyboard has been among the first means by which a human operator has been able to control or otherwise actively interface with the computer system.

At a very early point during the development of computer systems, it became necessary to have special instructions particularly keyed on the keyboard peripheral to facilitate interfacing with the computer systems. Such instructions were typically unique to the particular computer system or to the means by which information was formatted at its input or output.

Very often, the computer console included a number of toggle switches which could be set or reset to allow the computer operator to communicate special instructions to the computer system without dependence on the keyboard. Such toggle switches and computer consoles were generally arranged and configured as manually settable registers directly addressable through the central processing unit. Later, as systems were developed, it became an advantage to dedicate control keys on a keyboard in place of the toggle switches. But in each case, the dedicated key on the keyboard, like the toggle switches, had a singular significance which could be attributed to it by the operating computer system in which the keyboard was used. For example, in the case of word processors, control keys relating to ordinary typing functions and to particular word processing corrective functions or formatting functions are provided on the keyboard. These control keys are subject to the limitation and restriction that activation of any one control key cannot be varied by the operator but is fixed by the operating system and that multiple activation of character keys or control keys, which shall be referred to herein as "chording", has no intelligible significance to the operating system.

What is needed then is a methodology and means for allowing a keyboard input to efficiently communicate with data processing systems wherein operators of data processing systems have the option or capability of selectively changing the significance to be attributed to the activation of any given key and expanding the significance associated with key activation through chording a multiple number of keys.

The present invention is a method for encoding and communicating keyed input information to a data processing system comprising the steps of scanning a keyboard to detect activated keys. All activated keys detected during a scan of the entire keyboard are memorized. The memorized activated keys are then communicated to the data processing system as a single binary word of arbitrary bit length determined by the number of activated keys detected during the scan of the keyboard. By virtue of this combination of steps, a plurality of keys may be simultaneously activated to generate a binary word of arbitrary length. As used herein, "word" means a group of bits having a single cognitive meaning, i.e., the representation of a character, a control function, an instruction and the like. The binary word is capable of being associated in a computer system with a meaning which is unrelated to the meaning associated by the computer system with any one of the plurality of keys which is detected as being simultaneously activated during the scan of the keyboard.

The present invention also includes a keyboard interface circuit coupled to a plurality of keys of a keyboard and to a data processing system which information is communicated from the keyboard. The interface circuit comprises a scanning means for addressing the plurality of keys and detecting the activation status of each of the keys. A memory means is coupled to the scanning means for storing a representation of the activated keys detected during each addressing of all keys of the keyboard. A communication means is coupled to the memory means to selectively interface and transfer the stored representation to the data processing system as a binary word of arbitrary bit length determined by the number of keys detected as being activated during the addressing of all keys of the keyboard. By this combination of elements, a plurality of simultaneously activated keys is represented by a single binary word capable of being associated in the data processing system with a meaning which is unrelated to the meaning associated with the activation of any one of the plurality of keys.

The invention, its various objects and embodiments may be better understood by viewing the following figures in light of the detailed description of the preferred embodiments which are set forth by way of example.

FIG. 1 is a block diagram showing the relationships between the various operative elements of a keyboard interface organized according to the present invention.

FIGS. 2 and 3 are flow diagrams illustrating the keyboard scanning methodology of the present invention as implemented by the circuitry shown in FIG. 1.

FIG. 4 is a flow diagram illustrating the data transfer methodology of the present invention as it occurs as implemented by the circuitry shown in FIG. 1 to transfer data between a dedicated processor system and a data processing system of the circuitry.

The principal object of the present invention is to provide a means and methodology whereby a keyboard input device may be scanned to allow selective significance to be associated with the activation of any given key. Furthermore, an object of the invention is to allow simultaneous activation of a plurality of keys of a keyboard to be represented as a multiple-component binary word of arbitrary bit length having associated therewith an arbitrary meaning not necessarily related to the meaning of any component part of the word. In the preferred embodiment of the present invention, the multiple-component word is distinguished as a cognitive entity from its various component parts by setting the most significant bit of each component part to the same selected one of the two permissible binary values, except the most significant bit of the last component part of the multiple-component word, which is set to the other of the two permissible binary values. The most significant bit of each component part is tested and, unless the most significant bit is set to the other of the two permissible binary values, that part will be interpreted as a component part of a multiple-component word. In the preferred embodiment of the present invention, this interpretation is made both by a dedicated processor operatively associated with the keyboard and by the processor of the data processing system for which the keyboard is an input device. These and other objects and advantages of the present invention are best understood by first considering the circuitry of FIG. 1 in detail.

FIG. 1 shows a manually manipulated keyboard 10 in which keys are depressed to effect key activation, a keyboard control system 11 and an operatively associated data processing system 12. Data processing system 12 is more completely described in the copending application assigned to the same assignee as the present invention and filed simultaneously herewith by Richard W. Lowenthal, entitled MULTIPLE COMPUTING SYSTEMS AND COMMUNICATION BUS STRUCTURE THEREFOR, filed 10/15/81, Ser. No. 311,605.

Keyboard 10 is illustrated as having its keys organized into a switching array of sixteen rows, X0 through X15 and eight columns, Y0 through Y7. Keyboard 10 is constructed according to conventional principles and differs only from other keyboards in the number or significance attached to the keys and not in the particular manner of construction or physical organization of the keys. Thus, when a key is manually depressed by the operator in a scanned row, a signal will occur on the corresponding column output Y0-Y7 indicating its activation. If a key is not depressed at a column location of a scanned row, the column output remains inactive. Rows X0-X15 are sequentially addressed as described below, so that during any given time period, each of the activated keys in the addressed row will produce an active output signal on the associated column output Y0-Y7.

Keyboard 10, which may be physically housed in a central console, is coupled through a 24-line bus to a dedicated processor 36. The cable includes bus 14, coupling rows X0-X15 to multiplexer 16 and an 8-line bus 18 coupling the column output terminals Y0-Y7 to the dedicated processor system 36.

Multiplexer 16 is coupled by a 4-line bus 24 to the output of a counter 22 of the dedicated processor 36. Counter 22 provides a series of sixteen 4-bit words at its output beginning at 0000 and ending at 1111. The series of 4-bit words corresponds to the addresses of the rows X0-X15. The counter 22 is sequentially stepped through each of the row addresses in response to commands issued by a CPU 26 included in the dedicated processor system 36 to provide the series of 4-bit words to the multiplexer 16, one at a time. After cycling through the series of sixteen row addresses once, the counter 22 repeats the sixteen row address sequence. Multiplexer 16 decodes the 4-bit address generated by counter 22 to selectively activate each of the rows X0-X15 in sequence. Multiplexer 16 activates the addressed row by applying a voltage to one of the sixteen lines, X0-X15, according to the count received from counter 22. For example, the binary word 0000 generated by counter 22 and coupled to multiplexer 16 causes a row-activating voltage to be applied to the line associated with row X0, thereby, activating or selecting that row. Multiplexer maintains all other lines associated with the other row addresses X1-X15 at ground potential, or inactivated. The binary word 0001 causes multiplexer 16 to activate row X1 and so forth until the binary word 1111 causes activation of row X15 at the end of one row scanning sequence. If a key is depressed when a row is addressed, the voltage applied to the selected row by the multiplexer 16 is coupled to the corresponding column output line through a switch which is closed by depression of the key. Thus, as each row is addressed, the column output line corresponding to each depressed key in the addressed row will be activated. The column output line corresponding to each position of an undepressed or "up" key does not receive a voltage. In this manner, the eight column output lines Y0-Y7 provide an 8-bit binary signal that signifies the key depression status of the eight keys contained in each addressed row. This 8-bit column output signal is coupled by bus 18 to the CPU 26 of the dedicated processor system 36. The CPU 26 also receives an input from the row-address counter 22 over line 23 indicative of the 4-bit row address output sent to the multiplexer 16 resulting in the generation of the 8-bit column output signal. Thus, CPU 26 is provided with a number pair that permits the CPU 26 to detect the key depression status of each key in an addressed row, the number pair including the row address issued by the counter 22 and the column output signal received over bus 18. As will be explained in further detail hereinbelow with reference to FIGS. 2-4, CPU 26 responds to each column output signal by comparing the key depression status of each key represented by that signal with the key depression status of the same key existing at the time the same row was addressed during the immediately previous keyboard scan cycle. If a change in the key depression status has occurred in the row since it was addressed during the previous keyboard scan cycle, i.e., a previously undepressed key is depressed or a previously depressed key is released, a difference in the key depression status is detected. In that event, the CPU 26 causes the new key depression status to be stored for future comparisons and the dedicated processor system 36 is conditioned to transmit the new key depression status to the data processing system 12 at the appropriate time. The data processing system 12 includes a pair of memories, namely, map memory 28 and ring buffer memory 30, that cooperate with the CPU 26 in the execution of the aforedescribed comparison, storage and transmission of new key depression status.

Counter 22 is controlled by and is coupled to a dedicated CPU 26 for purposes of timing synchronization and communication by line 23. CPU 26 in turn is coupled to map and ring buffer memories 28 and 30 through conventional control lines 32 and a data address bus 34. Although each of the elements 22-34 have been separately described in the embodiment illustrated in FIG. 1, in the preferred embodiment each of these elements are combined into a single integrated circuit chip enclosed within the dotted lines 36. A conventional, firmware-programmed 8048 microcomputer chip is employed in the preferred embodiment as dedicated processor system 36. The component parts of processor system 36 have been separately illustrated and described in FIG. 1 only for the purposes of illustration and for clarity of understanding of the methodology of the present invention. The component description shown in FIG. 1 is not to be taken as a restriction or limitation of the scope of the present invention. For example, although multiplexer 16 and counter 22 are shown as separate elements, they may, in fact, be designated portions of the general microcomputer circuitry within the 8048 chip formed by any means well known in the art, such as by a combination of firmware-programmed memory and registers. Similarly, map and ring buffer memories 28 and 30 are shown as separate memories when, in fact, they may be separately designated portions of a single physical memory, which may further be combined on the same integrated circuit chip with CPU 26 as they are in the 8048 microprocessor. In addition, CPU 26 includes additional memory, not separately shown, for other program storage and other general uses.

CPU 26 of dedicated processor system 36 has a serial data output line 38 and a serial data input line 40. The clock rate of CPU 26 is controlled by a conventional crystal 42, whereby dedicated processor system 36 runs independently of and asynchronously with respect to data processing system 12. Dedicated processor system 36 and data processing system 12 communicate via data output line 38 and input line 40. The communication is coordinated through a conventional interrupt timing scheme executed by the CPU 26.

Data input line 40 is coupled to a buffer circuit 42 which includes a Schmitt trigger inverter, whose hysteresis improves noise immunity. Data output line 38 is similarly coupled to a buffer 44 which includes an open-collector TTL gate in combination with a pullup resistor to provide a voltage compatible signal to the data processing system 12.

The methodology of the present invention as implemented by the circuitry of FIG. 1 can better be understood by considering the operation of the circuitry as illustrated and explained in connection with FIGS. 2 and 3. FIG. 2 illustrates the scanning method implemented by the circuitry of FIG. 1 during its asynchronous and independent operation from a computer operating system type data processing system 12.

When the circuitry of FIG. 1 is turned-on at step 46, CPU 26 immediately resets all circuitry at step 48. Map memory 28, which stores representations of the depression status of the keys of keyboard 10, is initialized at step 50 to contain key up status representations for all keys. Ring buffer memory 30, which stores a transmission key code representation of each key depression status to be transmitted by the dedicated processor system 36 to the computer operating system 12, is emptied at step 52. An interrupt timer within processor system 36, in actuality a register or memory location controlled by CPU 26, is initialized and started. The interrupt timer cyclically counts down through a programmably determined interval to periodically test for a data transfer condition. As will be described in greater detail in connection with FIG. 4, the interrupt timer periodically interrupts the keyboard scanning operation executed by the CPU 26 and causes the CPU 26 to execute a data transfer interrupt operation. Processor system 36 has two settable flags or bit registers whose status determine the execution of steps of the keyboard scanning operation. The first flag is the output flag, which is cleared at step 56, and the second flag is the difference flag, which is cleared at step 58. The significance and function of each of these flags is described hereinafter in further detail.

As previously described, counter 22 counts through the row addresses and the column output signal on bus 18 signifies the key activation or depression status in each column during the addressing of any given row. At step 60, the counter 22 is commanded by CPU 26 to issue the address of the next row to be interrogated for key depressions. In the preferred embodiment, a new or "next" row is addressed approximately every one-half millisecond. As a result of the execution of step 60, CPU receives a unique pair of numbers, one from counter 22 and one from bus 18, which together indicate the specific row which has been addressed by counter 22 and the depression status of the keys in that row at the time of its addressing. Each key has a unique row and column number pair associated with it.

Map memory 28 forms a conceptual mirror image of the keys within keyboard 10. Map memory 28 has storage locations in an array of rows and columns which have a one-to-one mapping with the keys of keyboard 10. Each storage location in memory map 28 is a one bit cell. Initially, a binary value, one in the preferred embodiment, corresponding to a key up status condition is loaded into each cell at step 50. The storage locations in map memory 28 and rows of keyboard 10 are synchronously addressed by CPU 26 as keyboard 10 is scanned. At step 62, the contents of each addressed row of cells in map memory 28 are compared against the column output signal received over bus 18 in response to the addressing of the corresponding row of keys in keyboard 10. At step 64, the comparison is tested for a difference. If any one or more of the 8-bits forming the column output signal represents a key depression status that is different from that represented by the compared contents obtained from the corresponding storage location in the map memory 28, the difference flag is set at step 66 and the map memory 28 is updated at step 68 by loading into the map memory a new set of binary values corresponding to the compared column output signal. The new set of binary values are loaded at the addressed memory storage locations corresponding to the addressed row in the keyboard 10 containing the detected different key depression status. Setting the difference flag signifies the occurrence of a change in the key depression status between successive scans of the keyboard 10 and, as will be described in further detail hereinafter with reference to FIG. 3, prepares the dedicated processor system 36 to condition itself to output new key depression status of the keyboard resulting from the change. In practice, the difference flag is set only one time for each scan of the keyboard 10. However, there may be changes in the key depression status in more than one row of the keyboard, each of which would require an updating of the map memory 28. Thus, the difference test at step 64 is executed for each addressed row of the keyboard 10 and the map memory 28 is updated at step 68 whenever a difference is detected regardless of whether difference flag has been previously set.

Following the difference test and any updating of the map memory 28, a test is made at step 69 to determine if the output flag is set. As will be explained in further detail hereinafter with reference to FIG. 3, the output flag is set at the end of each scan of the entire keyboard 10 whenever at least one key depression status change is detected during the scan of the entire keyboard 10, as represented by the setting of the difference flag at step 66. Therefore, if the output flag is found to be set at step 69, it signifies that a key depression status change occurred between successive keyboard scans immediately preceding the current keyboard scan cycle being executed by the dedicated processor system 36. The output flag causes the dedicated processor system 36 to condition itself to output new key depression status at a time determined by the interrupt timer and data transfer interrupt routine illustrated in FIG. 4.

The output flag is cleared by the occurrence of either of two circumstances: the clearance of the output flag at step 56 (which, as described hereinbefore, occurs during the execution of initialization part of the keyboard scanning operation), and the clearance of the output flag at step 94 (see FIG. 3, which, as will be described further hereinafter, occurs if the key depression status of the keyboard 10 has not changed between successive scans of the keyboard). If the output flag is not set when tested at step 69, the keyboard scanning operation proceeds to step 76. As will be described in further detail hereinafter, a test is made at step 76 to determine if an input has been received by the dedicated processor system 36 for processing and, if so, the input is processed at step 78 before the keyboard scanning operation is resumed.

If the output flag is set when tested at step 69, the column loop steps 70-74 are executed to prepare an output for transmission to the computer operating system 12 representative of a changed key depression status detected between successive keyboard scans immediately preceding the current keyboard scan cycle being executed by the dedicated processor system 36. In the preferred embodiment, key-down status is transmitted. The transmission output is prepared from the 8-bit column output signal on a column bit-by-column bit basis. At step 70, a column bit of the 8-bit column output signal reflecting the changed key depression status is sampled and tested at step 71 to determine if it represents a key-down or depressed key. In the preferred embodiment, a binary value of zero represents a depressed key. If the test at step 71 reflects that the tested column bit is a binary one, a unique 8-bit code associated with the depressed key, such as an ASCII code, any other conventional key coding or an arbitrarily assigned key code devised by the user, is read in step 72 from an associated lookup table contained within a memory within the dedicated processor system 36 not separately shown in FIG. 1. This key code, termed a transmission key code, is loaded into ring buffer 30 at step 73 with its most significant bit set to binary zero. Thus, while map memory 28 serves as a physical map of the depressed status of the keys in keyboard 10, ring buffer 30 is a memory listing of transmission key codes ordered in chronological sequence of the corresponding sequence in which the depressed keys were detected. The scan rate is so much faster than possible key depression rates that the sequence is determined by the order of detection of key depression and not scan.

If the test at step 71 reflects that the tested column bit represents a key-up status, i.e., the bit is a binary zero, the keyboard scanning program proceeds to step 74. Step 74 is also entered after the execution of step 73. In any case, a test is made at step 74 to determine whether all the column bits associated with the row containing a changed key depression status have been examined. If not, steps 70 to 74 are repeated until all of the column bits have been examined and those indicative of depressed keys translated into transmission key codes and loaded in ring buffer 30.

After the column bits of the row are examined, it is possible that inputs have been received by the dedicated processor system 36 that remain unprocessed. Therefore, a test is made at step 76 to determine if any received input remains unprocessed. If there is an unprocessed input, the keyboard scanning operation is interrupted, the input is serviced at step 78 and the keyboard scanning operation resumed when the service is complete.

In any case, operation continues to step 80 (FIG. 3) where a determination is made as to whether all rows of the keyboard 10 have been addressed during the current keyboard scanning cycle. If not, the row loop steps 60 to 80 are repeated until all rows are addressed. Eventually, the addressing of all rows for the current keyboard scanning cycle is completed and any loading of the ring buffer memory 30 with information representative of the changed key depression status detected during the immediately previous keyboard scanning cycle is completed. When this is obtained, the output flag is examined at step 82.

If the output flag is clear, for example as a result of the execution of either step 56 or step 94, as described hereinbefore, step 84 is entered and a test of the state of the difference flag is made. If a key depression status change was detected at step 64, the difference flag is set and the output flag is set at step 86, after which the main loop is repeated, starting with step 58. If a key depression status change was not detected at step 64, the difference flag is not set at step 66 and step 94 is entered from step 84. At step 94, the output flag is cleared, after which the main loop is repeated, starting with step 58.

From the foregoing, it will be appreciated that the difference flag is set at step 66 only when a key depression status change occurs between successive scans of the keyboard 10. Furthermore, the output flag is signified as being set at step 66 only when such status change was detected during the immediately previous scan of the keyboard 10, the output flag being set at the conclusion of that immediately previous keyboard scanning cycle.

Returning to step 82, if the output flag is set at the time a scan of the keyboard 10 is completed (i.e., a key depression status change had occurred between successive scans of the keyboard 10 immediately preceding the current keyboard scan cycle), step 88 is entered. Upon entry of step 88, a determination is made whether any key was in the depressed state during the current keyboard scan cycle. There will be no keys in the depressed state at the time of such status change is detected whenever the change is from a status of one or more keys being depressed to a status of all keys being up. In such event, no transmission key code is entered in the ring buffer memory 30 by virtue of the execution of the column loop steps 70-74 earlier in the current keyboard scan cycle, even though a key depression status change was detected during the immediately previous keyboard scan cycle. As discussed hereinbefore, only key depressed status information is loaded in the ring buffer memory 30. To signify such a key depression status change, a special transmission key code signifying that no keys were in the depressed state is loaded at step 90 into ring buffer memory 30. Whether or not a key was in the depressed state upon the detection of a key depression status change, the most significant bit (MSB) of the last transmission key code entered into ring buffer memory 30 is set at step 92 to a selected one of the two permissible binary values, which in the preferred embodiment is binary one. As previously mentioned, all transmission key codes entered into the ring buffer memory 30 at step 73 during the scan of the keyboard 10 had their most significant bit set to the other of the permissible binary values, or zero. In this manner, a single binary word is entered in the ring buffer memory 30 during each scan of the keyboard 10 that represents the key depression status of the keyboard detected during that scan, if a key depression status change occurred between successive keyboard scans. The single binary word will include an arbitary number of bits depending upon the new key depression status of the keyboard. In the preferred embodiment the binary word includes any number of n×8 bits or n bytes, where n is any integral number not exceeding the capacity of the ring buffer memory 30. For memories of larger capacities, n can be any integral number up to the number of keys contained in the keyboard 10.

As described hereinbefore with reference to the execution of step 54, an interrupt timer included within CPU 26 cyclically counts through a predetermined interval, at the end of which the dedicated processor system 36 interrupts the keyboard scanning operation to test for a data transfer condition and execute a date transfer over either data input line 40 or data output line 38, if it is time to do so. In the preferred embodiment, a conventional interrupt timing scheme is implemented which results in the interruption of the keyboard scan operation each time the predetermined interval is counted, regardless of the point in the keyboard scan cycle such time occurs, and the resumption of the keyboard scan operation at the point of the interruption following the performance of the data transfer test and execution operation. Input and output data transfers are scheduled to be permitted at times separated by a selected number of the predetermined interval, with the input data transfer time and output data transfer time interleaved so as not to conflict. The input and output data transfer times are determined by a pair of counters, one for determining the input data transfer time and one for determining the output data transfer time. Each counter counts each time the predetermined interval is counted. When the counter has counted the selected number of times, a data transfer permitted condition is reached.

The interrupt timer and counters are set and started at step 54. In the preferred embodiment, the predetermined count is 160 microseconds the selected number of predetermine intervals is 5 and decrementing countdown counters are employed. Consequently, an interrupt of the keyboard scan operation occurs every 160 microseconds, but permitted input data transfer times and permitted output data transfer times are separated by 800 microseconds. In addition, the counter determining the permitted input data transfer time is settable by a start bit that precedes each transferred input data word so that input and output data transfer conflicts do not occur. In a conventional manner, the dedicated processor 36 responds to the receipt of a start bit received over data input line 40 by setting the input time counter so that the following input data received from the computer operating system 12 is accepted at a time that does not conflict with a scheduled permitted output data transfer time.

The input and output data transfer operations between the dedicated processor system 36 and the computer operating system 12 are illustrated in FIG. 4. When the aforementioned interrupt timer counts the 160 microsecond interval, step 95 is entered and the keyboard scan operation is interrupted. At the same time, the interrupt timer is reset. To enable the keyboard scan operation to be resumed at its interrupt point, the contents of an accumulator within dedicated processor system 36 identifying the location in the keyboard scan program at which the interrupt occurred are saved within an internal memory, not shown. The saved accumulator contents allow processor system 36 to service the data transfer routine, utilizing all elements of the dedicated processor system 36, without losing track of where the scanning method of the circuit was interrupted. Following completion of the data transfer operation, the saved accumulator contents are recalled from the internal memory and the keyboard scan operation is resumed at the point indicated by the recalled accumulator contents. A similar accumulator save is included within the service interrupt executed within step 78.

Following step 95, the input data transfer count is tested at step 96. The count is decremented once and is tested for a count of zero. If the decremented count is zero, the data transfer operation proceeds to step 98 and a test is made to determine if an input is in progress, which is signified by the dedicated processor sytem 36 having previously received a start bit over the input line 40 from the computer operating system 12. If a start bit has been received previously, input data line 40 is sampled at step 100 for inputting the bit then placed on the input data line by the computer operating system 12. Following the sampling of the input data line 40, the number of serially received bits is tested at step 102 to determine if a full byte has been received since the last start bit was received. If a full byte has been received, it is stored in the dedicated processing system at step 104 for processing at steps 76-78 of the keyboard scanning operation (FIG. 2).

After the input data transfer operation is complete, either by the execution of all steps 95-104 or by reaching a negative decision at any of the steps 96, 98 or 102, an output data transfer operation routine is performed by the dedicated processor system 36. First, the dedicated processor system 36 tests the output data transfer count at step 106. The count is decremented once and is tested for a count of zero. If the decremented count is zero, the data transfer operation proceeds to step 108. If the decremented count is not zero, the data transfer operation is terminated at the "interrupt end" step 107 and the dedicated processor system 36 resumes the keyboard scanning operation, as previously described.

At step 108, the operation of dedicated processor 36 is tested to determine if there is an output data operation in process, which is signified by a start bit having been previously output, but no following stop bit. Conventionally, each byte is formatted in the apparatus of the preferred embodiment so that it is preceded by a start bit and is followed by a stop bit. If an output is in process, operation proceeds to step 109 which tests tb determine if a full byte of data has been transmitted. If a full byte of data has been transmitted, step 111 is executed and a stop bit is transmitted from the ring buffer memory 30. If a full byte of data has not been transmitted, the next data bit of a byte is transmitted from the ring buffer memory 30 at step 110. Whether a data bit is transmitted by execution of step 110 or stop bit by execution of step 111, the data transfer operation is terminated following the transmission of either of the two bits at the following "interrupt end" step 107. As described previously, execution of the "interrupt end" step 107 returns the dedicated processor system 36 to the keyboard scan operation.

Returning to step 108, if the test performed by the dedicated processor system 36 at that time indicates that an output is not in process, the data transfer operation proceeds to step 112. In executing step 112, the dedicated processor system 36 tests to determine if there is any more bytes stored in the ring buffer memory 30. If additional bytes are so stored, a start bit preceding the next byte stored in the ring buffer memory 30 is transmitted at step 113. Following the transmission of the start bit or a decision at step 112 that no additional bytes are stored in the ring buffer memory 30, the data transfer operation is terminated by executing the "interrupt end" step 107, which returns the dedicated processor system 36 to the keyboard scan operation.

As will be appreciated from the foregoing description of the data transfer operation, data transferred between the computer operating system 12 and the dedicated processor system 36 on a bit-by-bit basis, with a single bit transferred during an interrupt of the keyboard scan operation when the interrupt occurs at a time when data transfer operation is scheduled to occur. With respect to output data transfers, the data stored in the ring buffer memory 30 is transferred bit-by-bit on a first in, first out basis. Furthermore, such transfers are much slower than the keyboard scan operations so that information is transferred between systems 12 and 36 on a bit-by-bit basis and keyboard scan operations continue between bit transfers. However, input and output data transfer cycles are completed in times much faster than any human operator can change key depressions. In the preferred embodiment, a data transfer cycle is initiated about every 800 microseconds. Typically, 8 milliseconds are required for a byte to be assembled in an input or output data transfer.

Thus, a method for scanning a keyboard through the circuitry of FIG. 1 has been disclosed in which any change of the status of activated or depressed keys within keyboard 10 is reflected in map memory 28 when such a difference arises. The contents of map memory 28 are translated into a transmission key code and transferred to a ring buffer memory 30, from which it may be ready by conventional means when an output time occurs.

By virtue of the aforedescribed keyboard scan operation, the object of simultaneous depression of a multiple number of keys is permitted and, thus, the operator may chord key depressions. Table 1 below illustrates four such cases. In the first case, the transmission key code represents a key depression status change involving a release of all keys previously depressed, which results in the special "ALL KEYS UP" transmission key code being loaded in the ring buffer 30 at step 90 of the keyboard scan operation. The second case represents a key depression status change leaving only one key depressed, showing the most significant bit of the corresponding byte has been set in the transmission key code loaded in the ring buffer memory 30. The third case represents a key depression status change leaving two keys depressed and their transmission key codes chorded. The last depressed key detected during the scan of the keyboard 10 has its most significant bit set to binary one. The fourth case illustrates a key depression status change leaving three keys depressed and their transmission key codes chorded. Again, the most significant bit of the last depressed key detected during the scan of keyboard 10 is to binary one. In the third and fourth illustrated cases, each transmission key code identifying a key other than the last detected depressed key has the most significant bit cleared to binary zero. The number of cases could be multipled to show chording with any arbitrary number of key depressions. In the illustrated table, time runs from right to left and each transmission key code is preceded by a low logic level start bit and is followed by a high logic level stop bit.

TABLE 1

```
                                          7         0
                                       ⌐|1 1 0 0 0 0 0 0|⌐
                                          NO KEYS DEPRESSED 7         0
                                       ⌐|1 X X X X X X X|⌐
                                          ONE KEY DEPRESSED 7         0   7         0
                       ⌐|1 X X X X X X X|0 X X X X X X X|⌐
                                          TWO KEYS DEPRESSED 7         0   7         0   7         0
     ⌐|1 X X X X X X X|0 X X X X X X X|0 X X X X X X X|⌐
        A ONE IN THE MOST                 THREE KEYS DEPRESSED
        SIGNIFICANT BIT POSITION
        INDICATES THE LAST BYTE
        IN THE SEQUENCE.
```

The dedicated processor system 36 scans keyboard 10 much faster than any human operator can operate the keys. Thus, it is highly improbable that any operator will actually activate two or more keys simultaneously in the sense that processor system 36 sees the activation at the same instant. For example, activation of any two keys would have to occur within a 7-9 millisecond interval. At this rate, "simultaneous" key depression is unlikely. However, the operation of the dedicated processor system 36 does allow the operator to hold a multiple number of the keys down simultaneously.

The cognitive significance attributed to a multiple key depression is determined by data processing system 12 and not by the keyboard scanning means described in detail in FIG. 1. The circuit of FIG. 1 permits chording by selective setting of the most significant bit of transmission key codes representing the detected depressed keys so that a word of arbitrary bit length can be formed. Therefore, the user is free to attribute any meaning to a chord with keyboard related limitations. The keyboard scan circuit of FIG. 1 is a scanning circuit which allows the data processing system 12 to choose a wide range of associations with permutations of depressed keys. For example, it is contemplated that in addition to normal typesetting functions such as bold facing, italicizing, setting upper and lower cases, underlining and the like, typefaces or alphabet types may be changed by special instructions entered through chording keys of the keyboard. For example, a data processing system coupled to a keyboard scan circuit of the present invention could be employed to alternately type the Roman alphabet, Arabic alphabet or various Japanese and Chinese alphabets or writing systems. Similarly, specialized graphic or computational routines may be entered through the use of multiple keyed instructions.

There is no limitation to the variation of significance associated by the data processing system to the output of the keyboard scan circuit. Such variations include not only the associations made with key activations as illustrated above, but the manner in which the keyboard scan circuit is perceived by the operator as well. For example, it is entirely possible that a data processing system could accommodate a varying output format from the keyboard scan circuit. Accommodations could thus be made to read the distinguishable permutations in terms of nondistinguishable combinations, that is, the depression of the key "A" and then "B" could be read by the data processing system as indistinguishable from the depression of the key "B" and then depression of the key "A". The data processing system could also insist that the operator maintain the key in an activated state for a predetermined amount of time in order to avoid spurious activations which may be unintentional as when neighboring keys may be brushed.

Thus, it can be seen that the keyboard scan circuitry of the present invention is extremely flexible and has a capability for virtually unlimited user modifications. In addition to the modifications described above, the internal transmission key coding with dedicated processor system 36 may be programmably changed such that the transmission key coding stored within ring buffer memory 30 from the look-up table from within CPU 26 may be programmably modified according to user option. Therefore, although the alphanumeric information has been indicated as being associated with ASCII codes, it is clear that any other type of transmission key coding may be optionally programmed into processor system 36 at the user's option.

The illustrated embodiment has been described only for the purposes of illustrating a preferred implementation of the present invention and it should not be taken to limit or restrict the scope of the present invention as set forth in the following claims. Many modifications and alterations may be made in the illustrated embodiment by those having ordinary skill in the art without departing from the spirit and scope of the present invention.

We claim:

1. A method for communicating keyed input information comprising the steps of:
   scanning a keyboard to detect activated keys;
   memorizing said activated keys;
   generating from the memorized keys a binary word having a bit length defined by the number of activated keys detected during one scan of said keyboard, said word having an identifiable byte corresponding to each of said memorized keys; and
   communicating said binary word.

2. The method of claim 1 wherein said step of memorizing includes the steps of setting a selected bit of the byte of said word corresponding to each activated key to one of two permissible binary values except the last activated key detected during said one scan of said keyboard, and setting a selected bit of the byte of said word corresponding to said last activated key to the other of the two permissible binary values.

3. The method of claim 2 wherein each selected bit is the most significant bit of its respective byte.

4. The method of claim 1 or 3 wherein said step of memorizing includes the steps of:
   storing representations of said activated keys in a map memory; and
   storing codes corresponding to said stored representations in a ring buffer memory.

5. The method of claim 4 wherein said step of communicating includes the steps of:
   indicating that a change in status of said activated keys has occurred; and
   reading said stored codes from said ring buffer memory when said change in status occurs.

6. A method for communicating keyed input information from a keyboard to a data processing system comprising the steps of:
   cyclically scanning each row of keys of a plurality of rows forming the keyboard;
   detecting the activated keys within the scanned row;
   generating a memory address for each activated key;
   addressing a first memory with said memory address;
   storing a representation of each activated key at a portion of said first memory corresponding to said generated address translating each representation stored in said first memory into a second memory as a unique code including a series of binary bits; and reading out said bits to create a binary word having a bit length defined by the number of activated keys detected during one scan cycle.

7. The method of claim 6 wherein the step of translating into a unique code comprises the steps of:
   setting a selected bit of each series stored in said second memory to one of two permissible binary values except the series last stored in said second memory during one scan of said keyboard, and
   setting a selected bit of said series last stored to the other of the two permissible binary values.

8. The method of claim 7 wherein each selected bit is the most significant bit of the series of bits.

9. A keyboard communication circuit coupled to a plurality of keys of a keyboard, comprising:
   scanning means for addressing said plurality of keys and for detecting the activation status of each one of said keys;
   memory means coupled to said scanning means for storing a first representation of each activated key detected during the addressing of the plurality of keys;
   means, coupled to said memory means, for generating from said stored first representations a distinct further representation in the form of a binary word having a bit length determined by the number of activated keys detected during one addressing of said plurality of keys, said word having an identifiable byte corresponding to each of said memorized keys; and
   means for communicating said word.

10. The circuit of claim 9 further comprising means for setting a selected bit of each byte corresponding to an activated key to one of two permissible binary values except the last activated key detected during one addressing of said plurality of keys, and means for setting a selected bit of the byte corresponding to said last activated key to the other of the two permissible binary values.

11. The circuit of claim 10 wherein each selected bit is the most significant bit of its byte.

12. The circuit of claim 9 or 11 wherein said memory means includes a map memory for storing the first representations corresponding to said detected activated keys; and a ring buffer memory for storing a code corresponding to each first representation stored in said map memory, said communication means forming said further representation from said stored codes.

13. The circuit of claim 12 wherein said communicating means includes means for indicating that a change in status of said activated key has occurred; and means for reading said stored codes in said ring buffer memory when said change in status is indicated.

14. An apparatus for communicating keying input data to a data processing system comprising:

scanning means for interrogating the keys of the keyboard and for detecting activated keys;

memory means coupled to said scanning means for storing codes associated with detected activated keys;

means for generating a binary word comprising a number of stored codes, one such code corresponding to each activated key detected during one interrogation of the entire keyboard; and means for communicating said word.

* * * * *